US012683400B2

(12) United States Patent
Shao et al.

(10) Patent No.: US 12,683,400 B2
(45) Date of Patent: Jul. 14, 2026

(54) HIGH ANTI-INTERFERENCE MICROSYSTEM BASED ON SYSTEM IN PACKAGE (SIP) FOR POWER GRID

(71) Applicant: Electric Power Research Institute of State Grid Zhejiang Electric Power Co., LTD, Hangzhou (CN)

(72) Inventors: Xianjun Shao, Hangzhou (CN); Xiaoxin Chen, Hangzhou (CN); Yiming Zheng, Hangzhou (CN); Chen Li, Hangzhou (CN); Jianjun Wang, Hangzhou (CN); Ping Qian, Hangzhou (CN); Hua Xu, Hangzhou (CN); Shaoan Wang, Hangzhou (CN); Shaohe Wang, Hangzhou (CN); Haibao Mu, Hangzhou (CN); Huibin Tao, Hangzhou (CN); Lin Zhao, Hangzhou (CN); Wenzhe Zheng, Hangzhou (CN); Dun Qian, Hangzhou (CN)

(73) Assignee: Electric Power Research institute of State Grid Zhejiang Electric Power Co., LTD, Hangzhou (CN)

( * ) Notice: Subject to any disclaimer, the term of this patent is extended or adjusted under 35 U.S.C. 154(b) by 467 days.

(21) Appl. No.: 18/229,189

(22) Filed: Aug. 2, 2023

(65) Prior Publication Data

US 2024/0106235 A1     Mar. 28, 2024

(30) Foreign Application Priority Data

Sep. 24, 2022    (CN) ......................... 202211168839.7

(51) Int. Cl.
*H02J 3/1842*        (2026.01)
*H05K 9/00*          (2006.01)

(52) U.S. Cl.
CPC .......... *H02J 3/1842* (2013.01); *H05K 9/0024* (2013.01)

(58) Field of Classification Search
CPC .. H05K 9/0024; H05K 9/0029; H05K 9/0031; H01L 23/552
See application file for complete search history.

(56) References Cited

U.S. PATENT DOCUMENTS

2009/0213561 A1* 8/2009 Mi ........................ H01L 23/645
                                            361/782
2017/0174506 A1* 6/2017 Gianchandani .......... B81B 7/02
                          (Continued)

FOREIGN PATENT DOCUMENTS

CN           114594351 A      6/2022

*Primary Examiner* — Sagar Shrestha
(74) *Attorney, Agent, or Firm* — Bayramoglu Law Offices LLC

(57) ABSTRACT

A high anti-interference microsystem based on System In Package (SIP) for a power grid is provided. The high anti-interference microsystem comprises a ceramic cavity, a ceramic substrate, a magnetic cover plate, a digital signal processing circuit, an analog signal conditioning circuit and a shield, wherein the ceramic cavity supports the ceramic substrate, the magnetic cover plate is in sealed contact with the ceramic cavity, and the ceramic substrate is arranged in a cavity formed by the ceramic cavity and the magnetic cover plate; a sealed shell of the microsystem based on SIP is composed of the magnetic cover plate and the ceramic cavity; the digital signal processing circuit and the analog signal conditioning circuit are arranged on the ceramic substrate and respectively process received signals to be processed; the shield covers an outer side of the sealed shell and is used for shielding external magnetic field interference.

7 Claims, 1 Drawing Sheet

(56)　　　　　　　References Cited

U.S. PATENT DOCUMENTS

| | | | | |
|---|---|---|---|---|
| 2017/0263569 | A1* | 9/2017 | Sommer | ............. H01L 23/3121 |
| 2017/0290207 | A1* | 10/2017 | Smith | ................. H05K 9/0088 |
| 2019/0363030 | A1* | 11/2019 | Yazaki | ................... H01L 23/15 |
| 2019/0363031 | A1* | 11/2019 | Kamada | ............... H05K 9/0024 |
| 2024/0168077 | A1* | 5/2024 | Chen | ...................... G01R 31/62 |

* cited by examiner

HIGH ANTI-INTERFERENCE MICROSYSTEM BASED ON SYSTEM IN PACKAGE (SIP) FOR POWER GRID

CROSS REFERENCE TO THE RELATED APPLICATIONS

This application is based upon and claims priority to Chinese Patent Application No. 202211168839.7, filed on Sep. 24, 2022, the entire contents of which are incorporated herein by reference.

TECHNICAL FIELD

This patent relates to the technical field of on-line monitoring of high-voltage bushings of power transmission and transformation equipment, and in particular to a high anti-interference microsystem based on System In Package (SIP) for a power grid.

The patent relates to the field of online monitoring technology for high-voltage bushings in power transmission and transformation equipment, particularly to a high anti-interference microsystem based on SIP for a power grid.

BACKGROUND

The electromagnetic environment of partial discharge monitoring for a transformer bushing in a substation comprises: a strong power-frequency leakage magnetic field, an extremely-high magnetic field, and a transient electric field. The electromagnetic environment causes abnormal transient current in the microsystem based on SIP, and leads to the function damage or performance degradation of circuits.

The existing microsystem based on SIP generally adopts a circuit structure of a board-level discrete device, and because the pins and circuit wiring or wiring are exposed on the surface, the size of an external power supply arranged outside and a board-level circuit is large, external interfaces are multiple, etc., it is not easy to shield electromagnetic.

Therefore, it is important to improve the anti-interference capability of the microsystem based on SIP.

SUMMARY

The present invention provides a high anti-interference microsystem based on SIP for a power grid, which is used for solving the following technical problem: how to improve the anti-interference capability of the microsystem based on SIP.

Therefore, the present invention adopts the following solution: Provided is a high anti-interference microsystem based on SIP for a power grid, comprising a ceramic cavity, a ceramic substrate, a magnetic cover plate, a digital signal processing circuit, an analog signal conditioning circuit and a shield; wherein:

the ceramic cavity supports the ceramic substrate, the magnetic cover plate is in sealed contact with the ceramic cavity, and the ceramic substrate is arranged in a cavity formed by the ceramic cavity and the magnetic cover plate;

a sealed shell of the microsystem based on SIP is composed of the magnetic cover plate and the ceramic cavity;

the digital signal processing circuit and the analog signal conditioning circuit are arranged on the ceramic substrate and respectively process received signals to be processed;

the shield covers an outer side of the sealed shell and used for shielding external magnetic field interference.

According to the present invention, by means of the composite structure of the ceramic substrate, the sealed shell and the shield, it is ensured that the SIP has a strong capability to suppress the electromagnetic field interference between frequency bands B1-B3, and the reliability of the product is effectively improved.

Furthermore, the shield comprises an inner shield arranged inside and an outer shield arranged outside;

the outer shield is a metal shield and used for shielding a magnetic field of a low frequency band B3;

the inner shield is a ferrite thin-walled shell and used for shielding a magnetic field of an intermediate frequency band B2.

The present invention adopts the structure of a double-layer shield with inner and outer layers, and thus can effectively suppress the electromagnetic field interference of the intermediate frequency band and the low frequency band.

Furthermore, the ceramic cavity and the ceramic substrate are sintered from ferrite ceramic materials and used for shielding a magnetic field of a high frequency band B1.

Furthermore, the microsystem based on SIP also comprises pins, wherein the pins are only a power supply pin, a signal input pin and a signal output pin;

the signal input pin and the signal output pin are respectively connected with the digital signal processing circuit and the analog signal conditioning circuit, the signal input pin is used for transmitting a signal to be processed to the digital signal processing circuit and the analog signal conditioning circuit, and the signal output pin is used for outputting the processed signal; the signal input pin and the signal output pin are led out from a position close to the edge of the ceramic substrate.

The circuit pins and the wires are arranged inside the ceramic cavity, and only the power supply, the sensor input and the external interface signal pin are reserved outside, so that the pins and the circuit wiring or wiring exposed in the electromagnetic environment are fewer, the coupling of a strong electromagnetic signal into the circuit is reduced, and the electromagnetic shielding effect is improved.

Furthermore, the cavity is composed of an upper cavity located above the ceramic substrate and a lower cavity located below the ceramic substrate, the digital signal processing circuit is installed on the ceramic substrate located at a bottom of the upper cavity, and the analog signal conditioning circuit is installed on the ceramic substrate located at a top of the lower cavity.

The upper cavity and the lower cavity separately arrange the digital circuit and the analog circuit, the analog circuit is arranged on the back surface of the ceramic substrate, the digital circuit is arranged on the front surface of the ceramic substrate, and the electromagnetic interference of the digital to analog in the circuits is effectively suppressed through the separation of two cavities.

Furthermore, the digital signal processing circuit comprises a field programmable gate array (FPGA) processor, and a double data rate (DDR), a FLASH, a CAN interface, an RS485 interface and an Ethernet card all connected with the FPGA processor, and performs sampling, storage, filtering and fast Fourier transform (FFT) processing on digital signals.

Even further, the FPGA processor is ZYNQ 7Z020 for implementing intelligent computing, data acquisition, logic control, communication and storage.

Even further, the FLASH selects a W25Q256 32 MB QSPI flash and supports the starting of an SD card.

Furthermore, the analog signal conditioning circuit comprises a low-frequency amplifier, a low-frequency analog to digital converter (ADC), a low-frequency low dropout regulator (LDO), a high-frequency amplifier, a high-frequency ADC, a high-frequency LDO and a reference source chip, and performs amplifying, filtering and analog-to-digital conversion to analog signals, and the low-frequency ADC and the high-frequency LDO are connected with the FPGA processor.

Even further, the analog signal conditioning circuit is processed through fully differential signal channels; a first channel of low frequency is taken as an example, low-frequency signals at positive and negative ends are converted into differential signals that can be received by the low-frequency ADC through a fully differential amplifier, and the digital signals converted by the low-frequency ADC are connected to the FPGA using low voltage differential signaling (LVDS) to enhance the anti-interference capacity.

The present invention has the following beneficial effects: the present invention adopts the structure of a double-layer shield with inner and outer layers, and thus can effectively suppress the electromagnetic field interference of the intermediate frequency band and the low frequency band. The present invention adopts an inner cavity separation structure and an outer integral separation structure, that is, both inner and outer separation, which improves the capability of shielding electromagnetic for the SIP and can effectively suppress the electromagnetic field interference of different frequency bands.

BRIEF DESCRIPTION OF THE DRAWINGS

The accompanying drawings described herein are included to provide a further understanding of the present invention and are incorporated in and constitute a part of the present invention, and schematic embodiments of the present invention together with the description are used to explain the present invention and do not constitute a limitation to the present invention. In the drawings.

DESCRIPTION OF THE REFERENCE NUMERALS

1—ceramic cavity, 2—magnetic cover plate, 3—ceramic substrate, 4—signal input pin, 5—outer shield, 6—inner shield, and 7—signal output pin; 101—FPGA, 102, 103—DDR, 104, 105—FLASH, 106—CAN interface, 107—RS485 interface and 108—Ethernet card; 201, 202, 203, 204—low-frequency amplifier, 205, 206, 207, 208—low-frequency ADC, 209, 210, 211, 212—low-frequency LDO, 213—high-frequency amplifier, 214—high-frequency ADC, 215—high-frequency LDO, 216, 217—other power supply LDO, and 218—reference source chip.

DETAILED DESCRIPTION OF THE EMBODIMENTS

In order to make the objectives, technical solutions and advantages of the present invention more apparent, the technical solutions of the present invention will be clearly and completely described below with reference to the specific embodiments of the present invention and the accompanying drawings. It is apparent that the described embodiments are only a part of the embodiments of the present invention, but not all of them. Based on the embodiments of the present invention, all other embodiments obtained by those of ordinary skill in the art without creative effort shall fall within the protection scope of the present invention.

The technical solution provided by the present invention is described in detail below with reference to the accompanying drawings.

Figure 1:
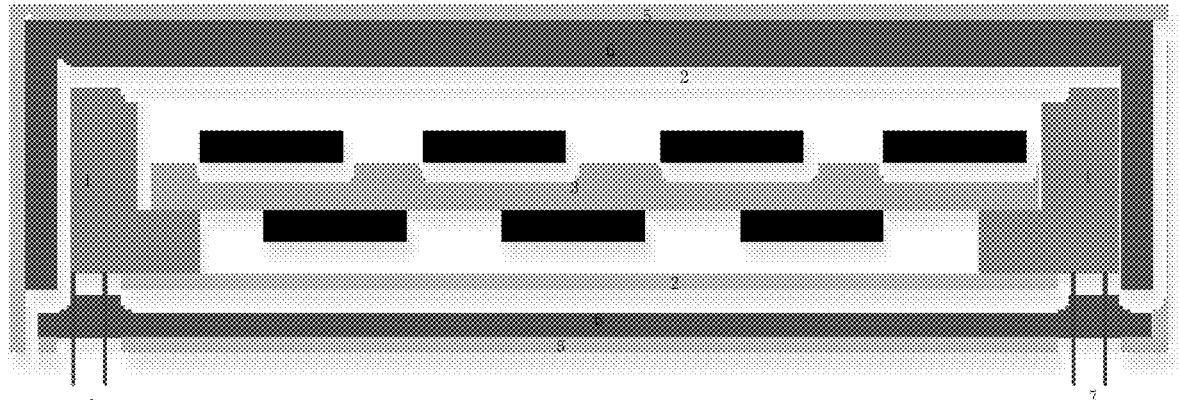
FIG. 1 is a schematic structural diagram of a high anti-interference microsystem based on SIP for a power grid according to the present invention.

FIG. 1 is a schematic structural diagram of a high anti-interference microsystem based on SIP for a power grid according to the present invention, and as shown in FIG. 1, the high anti-interference microsystem based on SIP for a power grid according to the present invention comprises: a ceramic cavity 1, a magnetic cover plate 2, a ceramic substrate 3, a signal input pin 4, an outer shield 5, an inner shield 6, a signal output pin 7, and a power supply pin.

As shown in FIG. 1, the ceramic cavity 1 is used for supporting the ceramic substrate 3; the magnetic cover plate 2 is in contact with the ceramic cavity 1 and forms the sealed shell of the microsystem based on SIP with the ceramic cavity 1; the digital signal processing circuit and the analog signal conditioning circuit are arranged on the ceramic substrate 3 and are used for processing received signals to be processed; the shield covers the outer side of the sealed shell and is used for shielding external magnetic field interference.

In one embodiment of the present invention, the ceramic cavity 1 is sintered from a ferrite ceramic material. The ceramic cavity 1 can shield the magnetic field of the frequency band B1 because the ferrite ceramic material has a high magnetic permeability to magnetic field of the frequency band B1.

As shown in FIG. 1, the ceramic substrate 3 of the present invention adopts a multi-layer double-sided structure, and two cavities (for the convenience of description, the upper cavity and the lower cavity are described below) are formed between the two magnetic cover plates 2 and the ceramic substrate 3, respectively, and are used for accommodating the digital signal processing circuit and the analog signal conditioning circuit.

It should be noted that in order to effectively shield the effect of the transient electromagnetic field on the circuits, the present invention provides a shield for the microsystem SIP.

In one embodiment of the present invention, the outer shield 5 and the inner shield 6 jointly form the shield of the microsystem SIP; the shield covers the outer side of the sealed shell and is used for shielding external magnetic field interference; wherein the outer shield 5 adopts a metal shield, and can shield the magnetic field of the frequency band B3 because the metal shield has a high magnetic permeability to the magnetic field of the frequency band B3.

Furthermore, if only the outer shield 5 is the metal shield, the magnetic field except the frequency band B3 cannot be shielded well, and an electrical clearance exists at the position where the pin is led out, magnetic shielding cannot be achieved well, and therefore the present invention provides an inner shield 6. The inner shield 6 is a ferrite thin-walled shell and has a high magnetic permeability to the magnetic field of the frequency band B2, and therefore can shield the magnetic field of the frequency band B2.

In one embodiment of the present invention, the upper cavity may be used for accommodating the digital signal processing circuit and the lower cavity may be used for accommodating the analog signal conditioning circuit; wherein the digital signal processing circuit and the analog signal conditioning circuit are arranged on two sides of the ceramic substrate 3 through a DIE packaging process.

Figure 2:
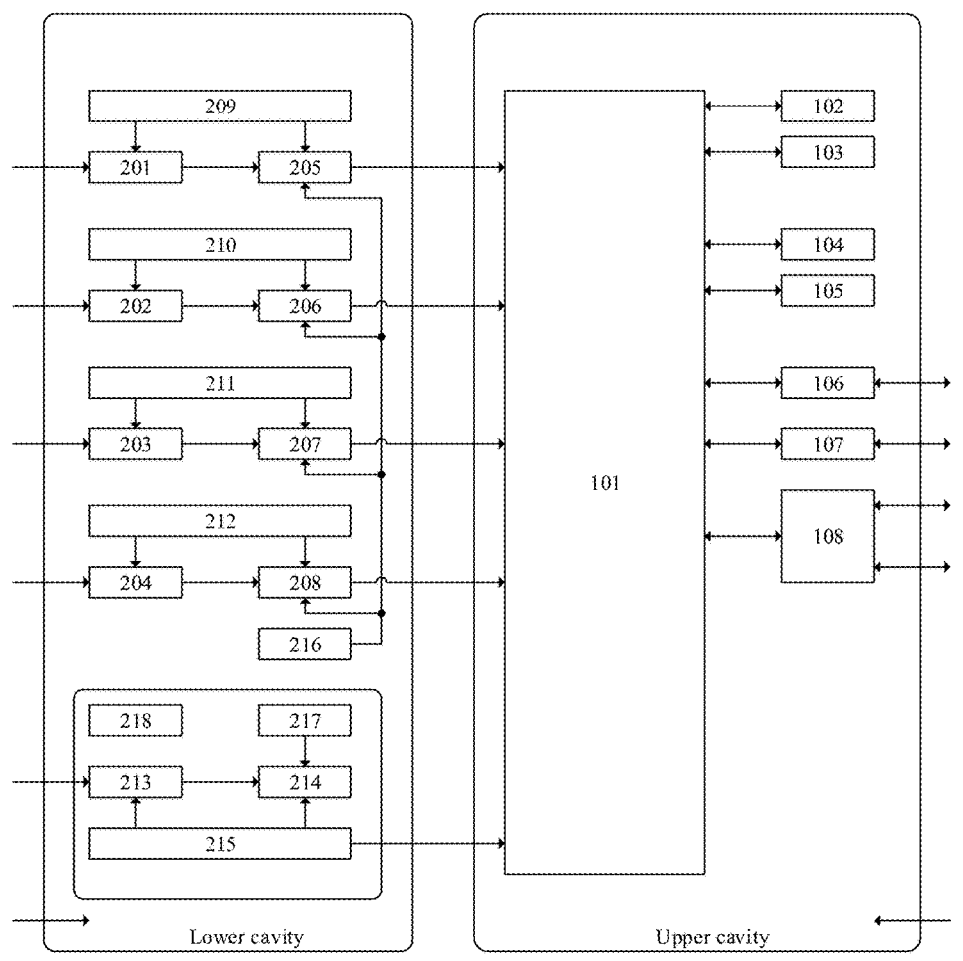
FIG. 2 is a schematic diagram of the connection between the digital signal processing circuit and the analog signal conditioning circuit according to the present invention.

Optionally, as shown in FIG. 2, the digital signal processing circuit comprises an FPGA processor, and a DDR, a FLASH, a CAN interface, an RS485 interface and an Ethernet card all connected with the FPGA processor, and performs sampling, storage, filtering and FFT processing on digital signals.

Optionally, the FPGA processor is ZYNQ 7Z020 for implementing intelligent computing, data acquisition, logic control, communication, storage and other functions.

Optionally, the DDR selects two DDR3 devices of model MT41K128M16HA to form a 512 MB memory.

Optionally, the FLASH selects a W25Q256 32 MB QSPI flash, and supports the starting of an SD card.

Optionally, the Ethernet card selects 88E1518 PHY chip and has gigabit optical fiber and electrical interface.

Optionally, as shown in FIG. 2, the analog signal conditioning circuit comprises a low-frequency amplifier, a low-frequency ADC, a low-frequency LDO, a high-frequency amplifier, a high-frequency ADC, a high-frequency LDO and a reference source chip, and performs amplifying, filtering and analog-to-digital conversion to analog signals, and the low-frequency ADC and the high-frequency LDO are connected with the FPGA processor.

The analog signal conditioning circuit is processed through fully differential signal channels; a first channel of low frequency is taken as an example, low-frequency signals at positive and negative ends are converted into differential signals that can be received by the low-frequency ADC through a fully differential amplifier, and the digital signals converted by the low-frequency ADC are connected to the FPGA using LVDS to enhance the anti-interference capacity.

Optionally, the low frequency of the analog signal conditioning circuit adopts 4 channel.

Optionally, the amplifier of each channel of the low-frequency channel is a fully differential amplifier THS4531, the gain is adjustable from 0 dB to 30 dB, and the unit gain bandwidth is 36 MHz.

Optionally, the low-frequency ADC is AD7960, with a resolution of 18 bits and a sampling rate of 5 MSPS per second.

Optionally, the high frequency of the analog signal conditioning circuit adopts 1 channel.

Optionally, the amplifier of each channel of the high-frequency channel is a fully differential amplifier THS4500, the gain is adjustable from 0 dB to 25 dB, and the unit gain bandwidth is 370 MHz.

Optionally, the high-frequency ADC is ADS5474, with a resolution of 14 bits and a sampling rate adjustable from 100 MSPS to 400 MSPS.

the signal input pin and the signal output pin are respectively connected with the digital signal processing circuit and the analog signal conditioning circuit, the signal input pin is used for transmitting a signal to be processed to the digital signal processing circuit and the analog signal conditioning circuit, and the signal output pin is used for outputting the processed signal; the signal input pin and the signal output pin are led out from a position close to an edge of the ceramic substrate.

All the embodiments in the present invention are described in a progressive manner, the same and similar parts among the embodiments are referred to each other, and each embodiment focuses on the differences from other embodiments. In particular, the device embodiments, which are substantially similar to the method embodiments, are described in a relatively simple manner, and reference may be made to some descriptions of the method embodiments for relevant parts.

It should be further noted that the terms "comprises", "comprising", or any other variation thereof, are intended to encompass a non-exclusive inclusion, such that a process, method, commodity, or equipment that includes a list of elements does not include only those elements but may include other elements not explicitly listed or inherent to such process, method, commodity, or equipment. Without further limitation, an element defined by the phrase "including a/an . . . " does not exclude the presence of another identical elements in the process, method, commodity or equipment that includes the element.

The above description is only the embodiments of the present invention and is not intended to limit the present invention. Various changes and improvements may be made to the present invention for those skilled in the art. Any modification, equivalent substitution, improvement and the like made within the spirit and principle of the present invention shall all fall within the scope of the claims of the present invention.

What is claimed is:

1. An anti-interference microsystem for a power grid, comprising a ceramic cavity, a ceramic substrate, a magnetic cover plate, a digital signal processing circuit, an analog signal conditioning circuit and a shield; wherein the ceramic cavity supports the ceramic substrate, the magnetic cover plate is in sealed contact with the ceramic cavity, and the ceramic substrate is arranged in a cavity formed by the ceramic cavity and the magnetic cover plate;

a sealed shell of the anti-interference microsystem is composed of the magnetic cover plate and the ceramic cavity;

the digital signal processing circuit and the analog signal conditioning circuit are arranged on the ceramic substrate and respectively process received signals to be processed;

the shield covers an outer side of the sealed shell and configured for shielding an external magnetic field interference, wherein the digital signal processing circuit comprises a field programmable gate array (FPGA) processor, and a double data rate (DDR), a FLASH, a CAN interface, an RS485 interface and an Ethernet card all connected with the FPGA processor, and performs sampling, storage, filtering and fast Fourier transform (FFT) processing on digital signals, wherein the analog signal conditioning circuit comprises a low-frequency amplifier, a low-frequency analog to digital converter (ADC), a low-frequency low dropout regulator (LDO), a high-frequency amplifier, a high-frequency ADC, a high-frequency LDO and a reference source chip, and performs amplifying, filtering and an analog-to-digital conversion to analog signals, and the low-frequency ADC and the high-frequency LDO are connected with the FPGA processor, wherein the analog signal conditioning circuit is processed through fully differential signal channels: a first channel of low frequency is taken as an example, low-frequency signals at positive and negative ends are converted into differential signals, wherein the differential signals can be received by the low-frequency ADC through a fully differential amplifier, and the digital signals converted by the low-frequency ADC are connected to the FPGA using low voltage differential signaling (LVDS) to enhance an anti-interference capacity.

2. The anti-interference microsystem according to claim 1, wherein the shield comprises an inner shield arranged inside and an outer shield arranged outside;

the outer shield is a metal shield and configured for shielding a magnetic field of a low frequency band B3;

the inner shield is a ferrite thin-walled shell and configured for shielding a magnetic field of an intermediate frequency band B2.

3. The high-anti-interference microsystem according to claim 1, wherein the ceramic cavity and the ceramic substrate are sintered from ferrite ceramic materials and configured for shielding a magnetic field of a high frequency band B1.

4. The high-anti-interference microsystem according to claim 1, further comprising pins, wherein the pins are only a power supply pin, a signal input pin and a signal output pin;

the signal input pin and the signal output pin are respectively connected with the digital signal processing circuit and the analog signal conditioning circuit, the signal input pin is configured for transmitting a signal to be processed to the digital signal processing circuit and the analog signal conditioning circuit, and the signal output pin is configured for outputting the processed signal; the signal input pin and the signal output pin are led out from a position adjacent to an edge of the ceramic substrate.

5. The high-anti-interference microsystem according to claim 1, wherein the cavity is composed of an upper cavity located above the ceramic substrate and a lower cavity located below the ceramic substrate, the digital signal processing circuit is installed on the ceramic substrate located at a bottom of the upper cavity, and the analog signal conditioning circuit is installed on the ceramic substrate located at a top of the lower cavity.

6. The anti-interference microsystem according to claim 1, wherein the FPGA processor is ZYNQ 7Z020 for implementing intelligent computing, data acquisition, logic control, communication and storage.

7. The high anti-interference microsystem according to claim 1, wherein the FLASH selects a W25Q256 32 MB QSPI flash and supports a starting of an SD card.

* * * * *